United States Patent
Kim

(10) Patent No.: US 11,322,186 B2
(45) Date of Patent: May 3, 2022

(54) ELECTRONIC DEVICES EXECUTING ACTIVE OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/071,369

(22) Filed: Oct. 15, 2020

(65) Prior Publication Data

US 2021/0407567 A1 Dec. 30, 2021

(30) Foreign Application Priority Data

Jun. 29, 2020 (KR) .................... 10-2020-0079639

(51) Int. Cl.
*G11C 7/22* (2006.01)
*G11C 7/10* (2006.01)

(52) U.S. Cl.
CPC ............. *G11C 7/222* (2013.01); *G11C 7/106* (2013.01); *G11C 7/1063* (2013.01); *G11C 7/1066* (2013.01); *G11C 7/1087* (2013.01); *G11C 7/1093* (2013.01)

(58) Field of Classification Search
CPC ..... G11C 7/222; G11C 7/1066; G11C 7/1093; G11C 7/1063; G11C 7/1087; G11C 7/106; G11C 8/12; G11C 8/18; G11C 5/025

See application file for complete search history.

(56) References Cited

U.S. PATENT DOCUMENTS

| | | | | |
|---|---|---|---|---|
| 2009/0063785 | A1* | 3/2009 | Gower | G11C 5/04 711/148 |
| 2013/0036273 | A1* | 2/2013 | Shaeffer | G11C 7/1048 711/148 |
| 2018/0364925 | A1* | 12/2018 | Park | G11C 7/1063 |
| 2021/0072902 | A1* | 3/2021 | Na | G06F 3/0659 |

FOREIGN PATENT DOCUMENTS

KR 1020170068690 A 6/2017

* cited by examiner

*Primary Examiner* — Jay W. Radke
(74) *Attorney, Agent, or Firm* — William Park & Associates Ltd.

(57) ABSTRACT

An electronic device includes a controller and a semiconductor device. The controller outputs a clock signal, a chip selection signal, and a command/address signal and receives and outputs a first data and a second data. The semiconductor device is synchronized with the clock signal to receive or output the first data through a first memory region that is selected by the command/address signal when the chip selection signal and the command/address signal have a logic level combination to perform a first active operation. In addition, the semiconductor device is synchronized with the clock signal to receive or output the second data through the first memory region and a second memory region that are selected by the command/address signal based on the chip selection signal during a second active operation after the first active operation.

24 Claims, 18 Drawing Sheets

FIG. 4

| OPERATION | SYNC | CS | CA<1> | CA<2> | CA<3> | CA<4> | CA<5> | CA<6> |
|---|---|---|---|---|---|---|---|---|
| ACTIVE-1 | ICLK | H | H | L | X | X | X | X |
| | ICLKB | L | BK<1> | BK<2> | BK<3> | COL<1> | COL<2> | COL<3> |
| ACTIVE-2 | ICLK | H | BG<1> | MR<1> | X | X | X | X |
| | ICLKB | L | X | X | X | X | X | X |

US 11,322,186 B2

ELECTRONIC DEVICES EXECUTING ACTIVE OPERATION

CROSS-REFERENCE TO RELATED APPLICATIONS

The present application claims priority under 35 U.S.C 119(a) to Korean Patent Application No. 10-2020-0079639, filed on Jun. 29, 2020, which is incorporated herein by reference in its entirety.

BACKGROUND

1. Technical Field

Embodiments of the present disclosure relate to electronic devices expanding a memory region receiving and outputting data during an active operation.

2. Related Art

In general, semiconductor devices, such as double data rate synchronous dynamic random access memory (DDR SDRAM) devices, are configured to perform a read operation or a write operation based on a command that is provided by an external chip set device. In order that the semiconductor devices perform the read operation or the write operation, each of the semiconductor devices must perform an active operation. The semiconductor devices may successively receive a command and an address through a command/address pin to generate an active command and an internal address to perform the active operation and may separate the command based on the address by using a chip selection signal.

SUMMARY

According to an embodiment, an electronic device includes a controller and a semiconductor device. The controller is configured to output a clock signal, a chip selection signal, and a command/address signal and is configured to receive or output a first data and a second data. The semiconductor device is configured to be synchronized with the clock signal to receive or output the first data through a first memory region that is selected by the command/address signal when the chip selection signal and the command/address signal have a logic level combination to perform a first active operation. In addition, the semiconductor device is configured to be synchronized with the clock signal to receive or output the second data through the first memory region and a second memory region that are selected by the command/address signal based on the chip selection signal during a second active operation after the first active operation.

According to another embodiment, an electronic device includes an active control circuit and an address generation circuit. The active control circuit is configured to generate first and second active signals and first and second address latch control signals to perform first and second active operations based on a logic level combination of an internal chip selection signal and a rising internal command/address signal. The address generation circuit is configured to generate a bank address and an internal address to perform the first and second active operations of first and second memory regions based on a falling internal command/address signal and the first address latch control signal. In addition, the address generation circuit is configured to generate first and second memory address signals and first and second bank group address signals to perform the second active operation of the first and second memory regions based on a rising internal command/address signal and the second address latch control signal.

BRIEF DESCRIPTION OF THE DRAWINGS

FIG. 4 is a table, illustrating logic levels of a chip selection signal and a command/address signal for performing first and second active operations, according to an embodiment of the present disclosure.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, and vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level that is higher than a voltage level of the logic "low" level. Meanwhile, logic levels of signals may be set to be different according to the embodiments. For example, a certain signal with a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
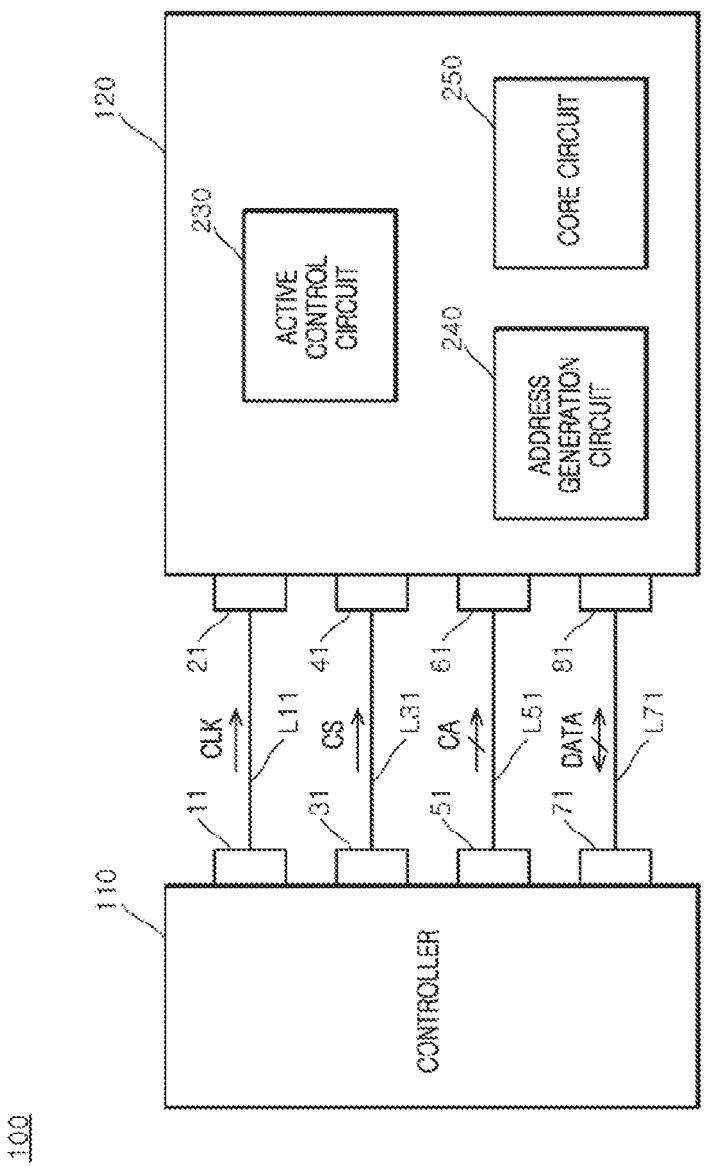
FIG. 1 is a block diagram, illustrating a configuration of an electronic device, according to an embodiment of the present disclosure.

As illustrated in FIG. 1, an electronic device 100, according to an embodiment, may include a controller 110 and a semiconductor device 120. The semiconductor device 120 may include an active control circuit 230, an address generation circuit 240, and a core circuit 250.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. The first control pin 11 and the first semiconductor pin 21 may be connected to each other by a first transmission line 11. The second control pin 31 and the second semiconductor pin 41 may be connected to each other through a second transmission line L31. The third control pin 51 and the third semiconductor pin 61 may be connected to each other through a third transmission line L51. The fourth control pin 71 and the fourth semiconductor pin 81 may be connected to each other through a fourth transmission line L71. The controller 110 may transmit a clock signal CLK to the semiconductor device 120 through the first transmission line L11 to control the semiconductor device 120. The controller 110 may transmit a chip selection signal CS to the semiconductor device 120 through the second transmission line L31 to control the semiconductor device 120. The controller 110 may transmit a command/address signal CA to the semiconductor device 120 through the third transmission line L51 to control the semiconductor device 120. The controller 110 may receive data DATA from the semiconductor device 120 or may transmit the data DATA to the semiconductor device 120, through the fourth transmission line L71.

The controller 110 may output the clock signal CLK, the chip selection signal CS, the command/address signal CA, and the data DATA to the semiconductor device 120 to perform first and second active operations. The controller 110 may receive the data DATA based on the semiconductor device 120 during the first and second active operations. The chip selection signal CS and the command/address signal CA may be successively outputted in synchronization with an odd pulse or an even pulse that is included in the clock signal CLK.

The active control circuit 230 may be synchronized with the clock signal CLK to generate a first active signal (ACT1 of FIG. 2) and a second active signal (ACT2 of FIG. 2) to perform the first and second active operations based on the chip selection signal CS and the command/address signal CA. The active control circuit 230 may be synchronized with the clock signal CLK to generate a first address latch control signal (IAF1 of FIG. 2) and a second address latch control signal (IAF2 of FIG. 2) to perform the first and second active operations based on the chip selection signal CS and the command/address signal CA.

Figure 2:
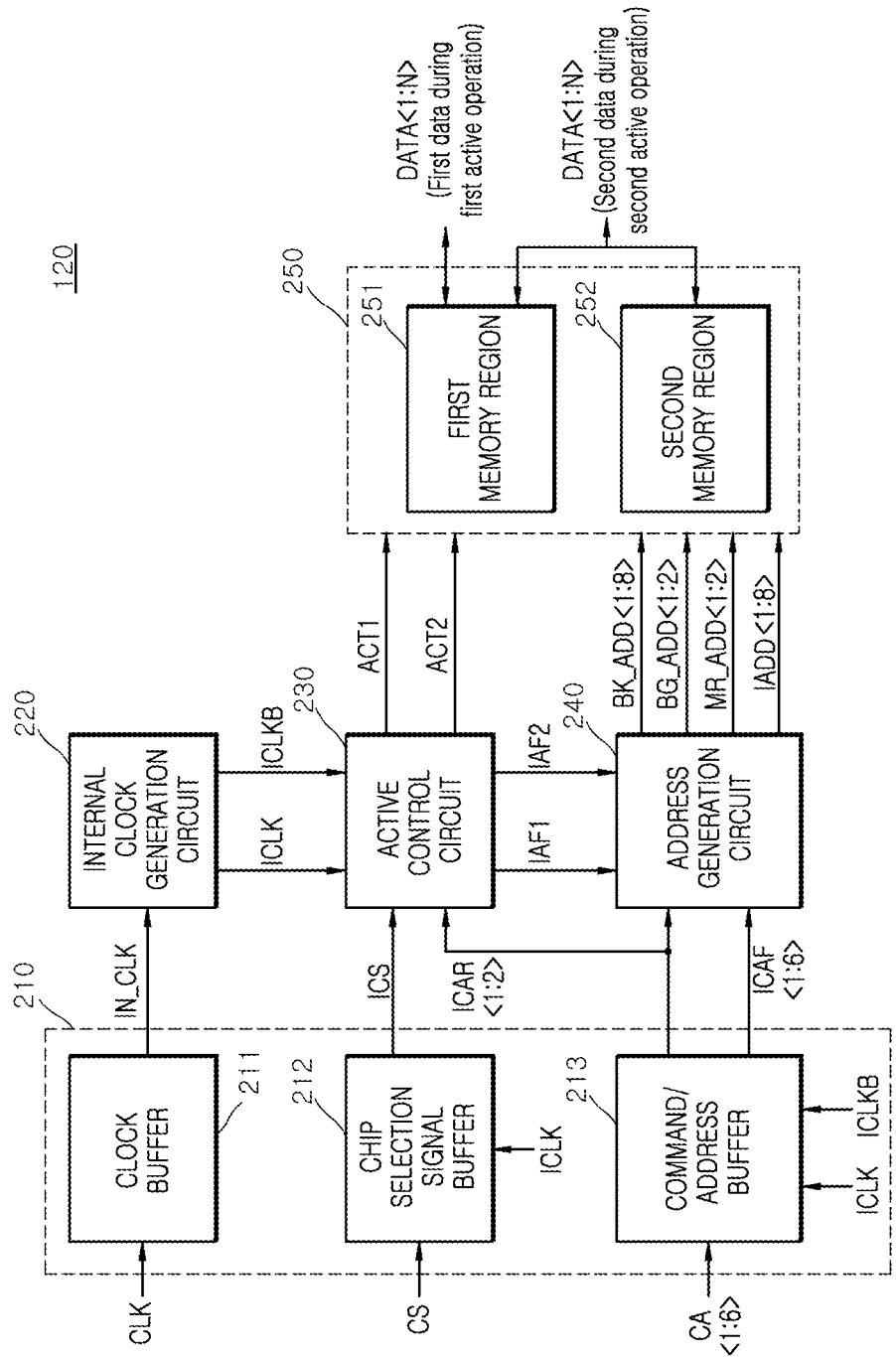
FIG. 2 is a block diagram, illustrating a configuration of a semiconductor device, included in the electronic device, illustrated in FIG. 1.

The address generation circuit 240 may generate a bank address (BK_ADD<1:8> of FIG. 2) and an internal address (IADD<1:8> of FIG. 2) based on the command/address signal CA and the first address latch control signal (IAF1 of FIG. 2). The address generation circuit 240 may generate a memory address (MR_ADD<1:2> of FIG. 2), a bank group address (BG_ADD<1:2> of FIG. 2), the bank address (BK_ADD<1:8> of FIG. 2), and the internal address (IADD<1:8> of FIG. 2) based on the command/address signal CA and the second address latch control signal (IAF2 of FIG. 2).

The core circuit 250 may receive or output the data DATA through a first memory region (251 of FIG. 2) based on the bank group address (BG_ADD<1:2> of FIG. 2) and the internal address (IADD<1:8> of FIG. 2) during the first active operation. The core circuit 250 may receive or output the data DATA through the first memory region (251 of FIG. 2) and a second memory region (252 of FIG. 2) based on the memory address (MR_ADD<1:2> of FIG. 2), the bank group address (BG_ADD<1:2> of FIG. 2), the bank address (BK_ADD<1:8> of FIG. 2), and the internal address (IADD<1:8> of FIG. 2) during the second active operation. Data that is inputted or outputted through the first memory region (251 of FIG. 2) during the first active operation may be set as a first data. Data that is inputted or outputted through the first and second memory regions (251 and 252 of FIG. 2) during the second active operation may be set as a second data.

The semiconductor device 120 may transmit or receive the data DATA during the first and second active operations. The semiconductor device 120 may be synchronized with the clock signal CLK to receive or output the data DATA through the first memory region (251 of FIG. 2) that is included in the core circuit 250 when the chip selection signal CS and the command/address signal CA have a logic level combination to perform the first active operation. The semiconductor device 120 may receive or output the data DATA through the first and second memory regions (251 and 252 of FIG. 2) that are included in the core circuit 250 during the second active operation performed based on the chip selection signal CS after the first active operation is performed.

FIG. 2 is a block diagram, illustrating a configuration of the semiconductor device 120. As illustrated in FIG. 2, the semiconductor device 120 may include a buffer circuit 210, an internal clock generation circuit 220, the active control circuit 230, the address generation circuit 240, and the core circuit 250.

The buffer circuit 210 may include a clock buffer 211, a chip selection signal buffer 212, and a command/address buffer 213.

The clock buffer 211 may buffer the clock signal CLK to generate an input clock signal IN_CLK. The clock buffer 211 may generate the input clock signal IN_CLK with the same phase as the clock signal CLK.

The chip selection signal buffer 212 may be synchronized with the input clock signal IN_CLK to generate an internal chip selection signal ICS based on the chip selection signal CS. The chip selection signal buffer 212 may buffer the chip selection signal CS in synchronization with a rising edge of an internal clock signal ICLK to generate the internal chip selection signal ICS.

The command/address buffer 213 may be synchronized with the internal clock signal ICLK and an inverted internal clock signal ICLKB to generate first and second rising internal command/address signals ICAR<1:2> and first to sixth falling internal command/address signals ICAF<1:6> based on the command/address signal CA (e.g., first to sixth command/address signals CA<1:6>). The command/address buffer 213 may buffer the first and second command/address signals CA<1:2> in synchronization with a rising edge of the internal clock signal ICLK to generate the first and second rising internal command/address signals ICAR<1:2>. The command/address buffer 213 may buffer the first to sixth command/address signals CA<1:6> in synchronization with a rising edge of the inverted internal clock signal ICLKB to generate the first to sixth falling internal command/address signals ICAF<1:6>.

The buffer circuit 210 may buffer the clock signal CLK to generate the input clock signal IN_CLK. The buffer circuit 210 may buffer the chip selection signal CS in synchronization with a rising edge of the clock signal CLK to generate the internal chip selection signal ICS. The buffer circuit 210 may buffer the first and second command/address signals CA<1:2> in synchronization with a rising edge of the clock signal CLK to generate the first and second rising internal command/address signals ICAR<1:2>. The buffer circuit 210 may buffer the first to sixth command/address signals CA<1:6> in synchronization with a falling edge of the clock signal CLK to generate the first to sixth falling internal command/address signals ICAF<1:6>.

The internal clock generation circuit 220 may receive the input clock signal IN_CLK to generate the internal clock signal ICLK and the inverted internal clock signal ICLKB. The internal clock generation circuit 220 may generate the internal clock signal ICLK with the same phase as the input clock signal IN_CLK. The internal clock generation circuit 220 may generate the inverted internal clock signal ICLKB with an opposite phase to the input clock signal IN_CLK. The input clock signal IN_CLK, the internal clock signal ICLK, and the inverted internal clock signal ICLKB may be generated to have the same frequency and the same toggling cycle. Operations of the internal clock generation circuit 220 to generate the internal clock signal ICLK and the inverted internal clock signal ICLKB based on the input clock signal IN_CLK will be described in detail with reference to FIG. 3 later.

The active control circuit 230 may be synchronized with the internal clock signal ICLK and the inverted internal clock signal ICLKB to generate the first active signal ACT1 and the second active signal ACT2 to perform the first and second active operations based on the internal chip selection signal ICS and the first and second rising internal command/address signals ICAR<1:2>. The active control circuit 230 may be synchronized with the internal clock signal ICLK and the inverted internal clock signal ICLKB to generate the first address latch control signal IAF1 and the second address latch control signal IAF2 to perform the first and second active operations based on the internal chip selection signal ICS and the first and second rising internal command/address signals ICAR<1:2>.

The active control circuit 230 may be synchronized with the internal clock signal ICLK and the inverted internal clock signal ICLKB to generate the first active signal ACT1 and the first address latch control signal IAF1 that are enabled when the internal chip selection signal ICS and the first and second rising internal command/address signals ICAR<1:2> have a logic level combination to perform the first active operation. The active control circuit 230 may be synchronized with the internal clock signal ICLK and the inverted internal clock signal ICLKB to generate the second active signal ACT2 and the second address latch control signal IAF2 that are enabled when the internal chip selection signal ICS is inputted after the first active signal ACT1 is generated.

The address generation circuit 240 may generate the bank address BK_ADD<1:8> (i.e., first to eighth bank address signals BK_ADD<1:8>) and the internal address IADD<1:8> (i.e., first to eighth internal address signals IADD<1:8>) based on the first to sixth falling internal command/address signals ICAF<1:6> during the first active operation. The address generation circuit 240 may latch the first to sixth falling internal command/address signals ICAF<1:6> based on the first address latch control signal IAF1 to generate the first to eighth bank address signals BK_ADD<1:8> and the first to eighth internal address signals IADD<1:8>. The address generation circuit 240 may generate the memory address MR_ADD<1:2> (i.e., first and second memory address signals MR_ADD<1:2>) and the bank group address BG_ADD<1:2> (i.e., first and second bank group address signals BG_ADD<1:2>), the first to eighth bank address signals BK_ADD<1:8>, and the first to eighth internal address signals IADD<1:8> based on the first and second rising internal command/address signals ICAR<1:2> and the first to sixth falling internal command/address signals ICAF<1:6> during the second active operation. The address generation circuit 240 may latch the first and second rising internal command/address signals ICAR<1:2> based on the second address latch control signal IAF2 to generate the first and second memory address signals MR_ADD<1:2> and the first and second bank group address signals BG_ADD<1:2>.

The core circuit 250 may include the first memory region 251 and the second memory region 252.

The first memory region 251 may receive or output first to $N^{th}$ data DATA<1:N> through one of a plurality of banks that is selected by the first to eighth bank address signals BK_ADD<1:8> and the first to eighth internal address signals IADD<1:8> during the first active operation. The first memory region 251 may receive or output the first to $N^{th}$ data DATA<1:N> through a bank that is selected by the first to eighth bank address signals BK_ADD<1:8> and the first to eighth internal address signals IADD<1:8> when the first active signal ACT1 is enabled. The first memory region 251 may receive or output the first to $N^{th}$ data DATA<1:N> through one of a plurality of banks that is selected by the first to eighth bank address signals BK_ADD<1:8> and the first to eighth internal address signals IADD<1:8> during the second active operation. The first memory region 251 may receive or output the first to N$^{th}$ data DATA<1:N> through a bank that is selected by the first and second bank group address signals BG_ADD<1:2>, the first to eighth bank address signals BK_ADD<1:8>, and the first to eighth internal address signals IADD<1:8> when the second active signal ACT2 and the first memory address signal MR_ADD<1> are enabled.

The second memory region 252 may receive or output the first to N$^{th}$ data DATA<1:N> through one of a plurality of banks that is selected by the first to eighth bank address signals BK_ADD<1:8> and the first to eighth internal address signals IADD<1:8> during the second active operation. The second memory region 252 may receive or output the first to N$^{th}$ data DATA<1:N> through a bank that is selected by the first and second bank group address signals BG_ADD<1:2>, the first to eighth bank address signals BK_ADD<1:8>, and the first to eighth internal address signals IADD<1:8> when the second active signal ACT2 and the second memory address signal MR_ADD<2> are enabled.

The core circuit 250 may receive or output the first to N$^{th}$ data DATA<1:N> through the first memory region 251 based on the first to eighth bank address signals BK_ADD<1:8> and the first to eighth internal address signals IADD<1:8> during the first active operation. The core circuit 250 may receive or output the first to N$^{th}$ data DATA<1:N> through the first memory region 251 and the second memory region 252 based on the first and second memory address signals MR_ADD<1:2>, the first and second bank group address signals BG_ADD<1:2>, the first to eighth bank address signals BK_ADD<1:8>, and the first to eighth internal address signals IADD<1:8> during the second active operation. The first to N$^{th}$ data DATA<1:N> that is inputted or outputted through the first memory region 251 during the first active operation may be set as a first data. The first to N$^{th}$ data DATA<1:N> that is inputted or outputted through the first and second memory regions 251 and 252 during the second active operation may be set as a second data.

Figure 3:
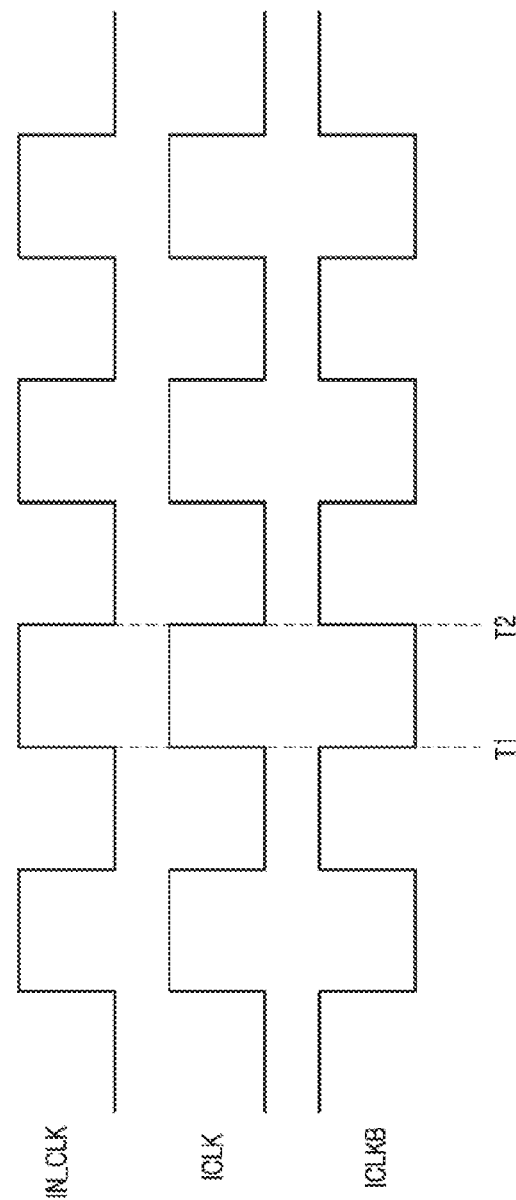
FIG. 3 is a timing diagram, illustrating an operation of an internal clock generation circuit, included in the semiconductor device, illustrated in FIG. 2.

An operation of the internal clock generation circuit 220 will be described hereinafter with reference to FIG. 3.

The internal clock generation circuit 220 may generate the internal clock signal ICLK with the same phase as the input clock signal IN_CLK. The internal clock generation circuit 220 may generate the inverted internal clock signal ICLKB with an opposite phase to the input clock signal IN_CLK.

At time "T1", the internal clock generation circuit 220 may be synchronized with a rising edge of the input clock signal IN_CLK to generate the internal clock signal ICLK that is toggled to have a logic "high" level.

At time "T2", the internal clock generation circuit 220 may be synchronized with a falling edge of the input clock signal IN_CLK to generate the inverted internal clock signal ICLKB that is toggled to have a logic "high" level.

Logic level combinations of the chip selection signal CS and the command/address signal CA to perform the first and second active operations according to an embodiment will be described hereinafter with reference to FIG. 4.

The active operation ACTIVE-1 may be performed when the first command/address signal CA<1> that is inputted in synchronization with the internal clock signal ICLK has a logic "high(H)" level and the second command/address signal CA<2> that is inputted in synchronization with the internal clock signal ICLK has a logic "low(L)" level while the chip selection signal CS has a logic "high(H)" level. A predetermined logic level combination of the chip selection signal CS and the first and second command/address signals CA<1:2> to perform the first active operation ACTIVE-1 is set as 'H,H,L', which means that the chip selection signal CS has a logic "high(H)" level, the first command/address signal CA<1> has a logic "high(H)" level, and the second command/address signal CA<2> has a logic "high(L)" level.

During the first active operation ACTIVE-1, the first command/address signal CA<1> that is inputted in synchronization with the inverted internal clock signal ICLKB while the chip selection signal CS has a logic "low(L)" level may be set as a first bit BK<1> to generate the first to eighth bank address signals BK_ADD<1:8>. During the first active operation ACTIVE-1, the second command/address signal CA<2> that is inputted in synchronization with the inverted internal clock signal ICLKB while the chip selection signal CS has a logic "low(L)" level may be set as a second bit BK<2> to generate the first to eighth bank address signals BK_ADD<1:8>. During the first active operation ACTIVE-1, the third command/address signal CA<3> that is inputted in synchronization with the inverted internal clock signal ICLKB while the chip selection signal CS has a logic "low(L)" level may be set as a third bit BK<3> to generate the first to eighth bank address signals BK_ADD<1:8>.

During the first active operation ACTIVE-1, the fourth command/address signal CA<4> that is inputted in synchronization with the inverted internal clock signal ICLKB while the chip selection signal CS has a logic "low(L)" level may be set as a first bit COL<1> to generate the first to eighth internal address signals IADD<1:8>. During the first active operation ACTIVE-1, the fifth command/address signal CA<5> that is inputted in synchronization with the inverted internal clock signal ICLKB while the chip selection signal CS has a logic "low(L)" level may be set as a second bit COL<2> to generate the first to eighth internal address signals IADD<1:8>. During the first active operation ACTIVE-1, the sixth command/address signal CA<6> that is inputted in synchronization with the inverted internal clock signal ICLKB while the chip selection signal CS has a logic "low(L)" level may be set as a third bit COL<3> to generate the first to eighth internal address signals IADD<1:8>.

The second active operation ACTIVE-2 may be performed when the chip selection signal CS with a logic "high(H)" level is inputted again after the first active operation ACTIVE-1 is performed.

During the second active operation ACTIVE-2, the first command/address signal CA<1> that is inputted in synchronization with the internal clock signal ICLK while the chip selection signal CS has a logic "high(H)" level may be set as a first bit BG<1> to generate the first and second bank group address signals BG_ADD<1:2>. During the second active operation ACTIVE-2, the second command/address signal CA<2> that is inputted in synchronization with the internal clock signal ICLK while the chip selection signal CS has a logic "high(H)" level may be set as a first bit MR<1> to generate the first and second memory address signals MR_ADD<1:2>.

Symbols "X" denoted in FIG. 4 means command/address signals that are not used during the first and second active operations ACTIVE-1 and ACTIVE-2.

In an embodiment of the present disclosure, the number of bits that are included in the command/address signal to perform the second active operation may be reduced, thereby increasing an amount of information that is inputted through unused bits of the command/address signal illustrated in FIG. 4.

Figure 5:
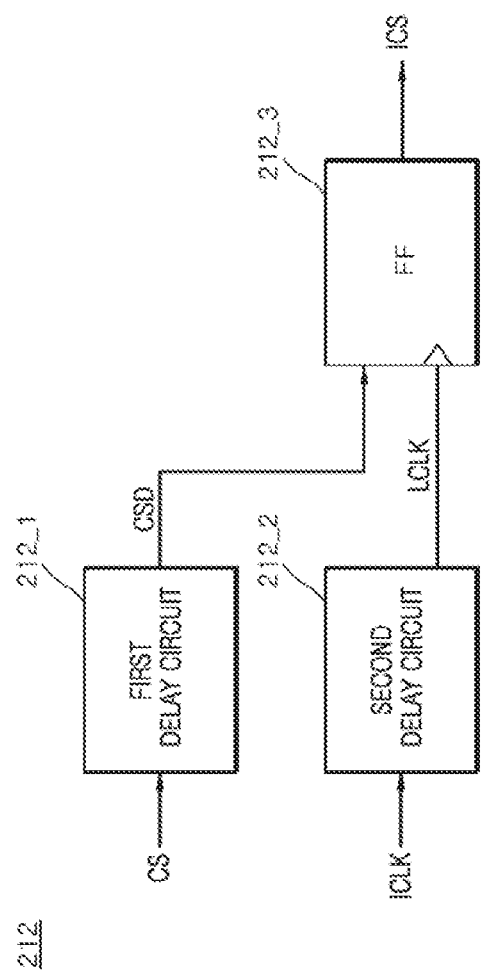
FIG. 5 is a block diagram, illustrating a configuration of a chip selection signal buffer, included in the semiconductor device, illustrated in FIG. 2.

As illustrated in FIG. 5, the chip selection signal buffer 212 may include a first delay circuit 212_1, a second delay circuit 212_2, and a first synchronization circuit 212_3.

The first delay circuit 212_1 may delay the chip selection signal CS to generate a delayed chip selection signal CSD. The first delay circuit 212_1 may delay the chip selection signal CS by a write latency period and a read latency period to generate the delayed chip selection signal CSD.

The second delay circuit 212_2 may delay the internal clock signal ICLK to generate a latency clock signal LCLK. The second delay circuit 212_2 may delay the internal clock signal ICLK by the write latency period and the read latency period to generate the latency clock signal LCLK.

The first synchronization circuit 212_3 may be synchronized with the latency clock signal LCLK to output the delayed chip selection signal CSD as the internal chip selection signal ICS. The first synchronization circuit 212_3 may output the delayed chip selection signal CSD as the internal chip selection signal ICS while the latency clock signal LCLK with a logic "high" level is inputted to the first synchronization circuit 212_3. The first synchronization circuit 212_3 may be realized by using a flip-flop.

Figure 6:
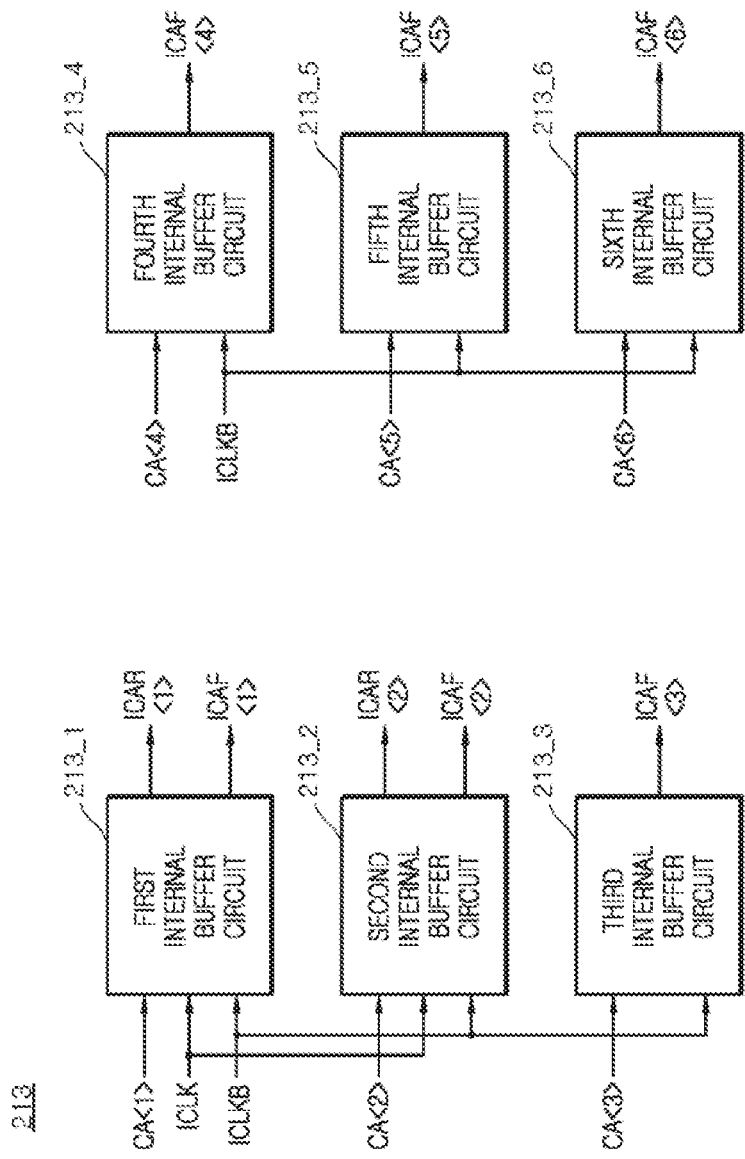
FIG. 6 is a block diagram, illustrating a configuration of a command/address buffer, included in the semiconductor device, illustrated in FIG. 2.

As illustrated in FIG. 6, the command/address buffer 213 may include a first internal buffer circuit 213_1, a second internal buffer circuit 213_2, a third internal buffer circuit 213_3, a fourth internal buffer circuit 213_4, a fifth internal buffer circuit 213_5, and a sixth internal buffer circuit 213_6.

The first internal buffer circuit 213_1 may be synchronized with a rising edge of the internal clock signal ICLK to output the first command/address signal CA<1> as the first rising internal command/address signal ICAR<1>. The first internal buffer circuit 213_1 may output the first command/address signal CA<1> as the first rising internal command/address signal ICAR<1> while the internal clock signal ICLK has a logic "high" level. The first internal buffer circuit 213_1 may be synchronized with a rising edge of the inverted internal clock signal ICLKB to output the first command/address signal CA<1> as the first falling internal command/address signal ICAF<1>. The first internal buffer circuit 213_1 may output the first command/address signal CA<1> as the first falling internal command/address signal ICAF<1> while the inverted internal clock signal ICLKB has a logic "high" level.

The second internal buffer circuit 213_2 may be synchronized with a rising edge of the internal clock signal ICLK to output the second command/address signal CA<2> as the second rising internal command/address signal ICAR<2>. The second internal buffer circuit 213_2 may output the second command/address signal CA<2> as the second rising internal command/address signal ICAR<2> while the internal clock signal ICLK has a logic "high" level. The second internal buffer circuit 213_2 may be synchronized with a rising edge of the inverted internal clock signal ICLKB to output the second command/address signal CA<2> as the second falling internal command/address signal ICAF<2>. The second internal buffer circuit 213_2 may output the second command/address signal CA<2> as the second falling internal command/address signal ICAF<2> while the inverted internal clock signal ICLKB has a logic "high" level.

The third internal buffer circuit 213_3 may be synchronized with a rising edge of the inverted internal clock signal ICLKB to output the third command/address signal CA<3> as the third falling internal command/address signal ICAF<3>. The third internal buffer circuit 213_3 may output the third command/address signal CA<3> as the third falling internal command/address signal ICAF<3> while the inverted internal clock signal ICLKB has a logic "high" level.

The fourth internal buffer circuit 213_4 may be synchronized with a rising edge of the inverted internal clock signal ICLKB to output the fourth command/address signal CA<4> as the fourth falling internal command/address signal ICAF<4>. The fourth internal buffer circuit 213_4 may output the fourth command/address signal CA<4> as the fourth falling internal command/address signal ICAF<4> while the inverted internal clock signal ICLKB has a logic "high" level.

The fifth internal buffer circuit 213_5 may be synchronized with a rising edge of the inverted internal clock signal ICLKB to output the fifth command/address signal CA<5> as the fifth falling internal command/address signal ICAF<5>. The fifth internal buffer circuit 213_5 may output the fifth command/address signal CA<5> as the fifth falling internal command/address signal ICAF<5> while the inverted internal clock signal ICLKB has a logic "high" level.

The sixth internal buffer circuit 213_6 may be synchronized with a rising edge of the inverted internal clock signal ICLKB to output the sixth command/address signal CA<6> as the sixth falling internal command/address signal ICAF<6>. The sixth internal buffer circuit 213_6 may output the sixth command/address signal CA<6> as the sixth falling internal command/address signal ICAF<6> while the inverted internal clock signal ICLKB has a logic "high" level.

Figure 7:
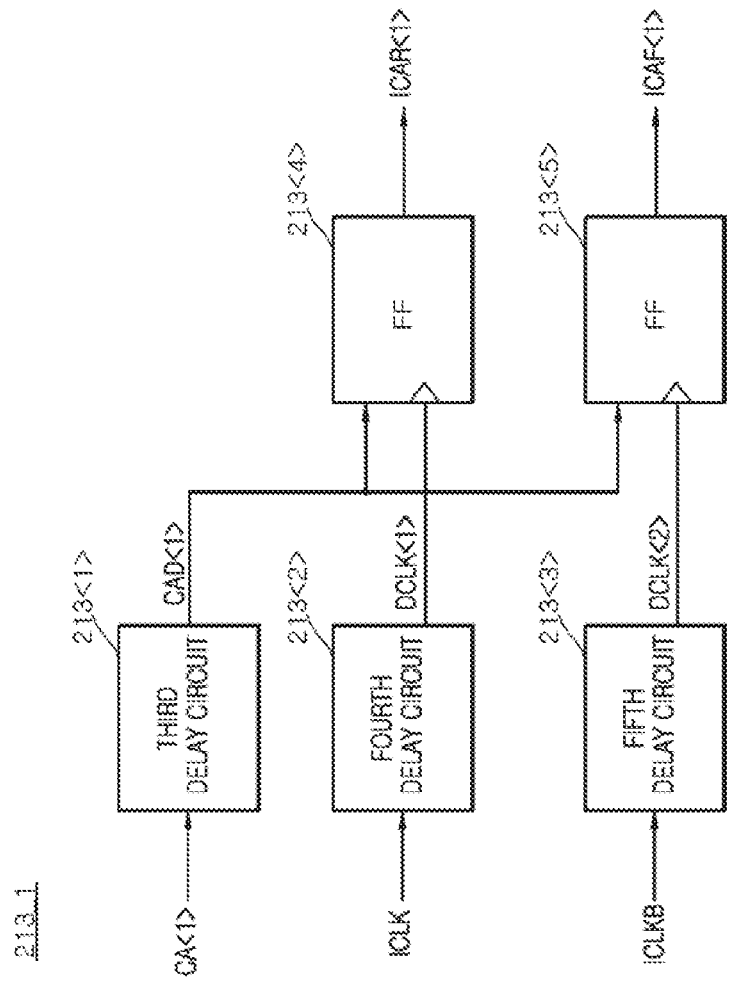
FIG. 7 is a block diagram, illustrating a configuration of a first internal buffer circuit, included in the command/address buffer, illustrated in FIG. 6.

As illustrated in FIG. 7, the first internal buffer circuit 213_1 may include a third delay circuit 213<1>, a fourth delay circuit 213<2>, a fifth delay circuit 213<3>, a second synchronization circuit 213<4>, and a third synchronization circuit 213<5>.

The third delay circuit 213<1> may delay the first command/address signal CA<1> to generate a first delayed command/address signal CAD<1>. The third delay circuit 213<1> may delay the first command/address signal CA<1> by the write latency period and the read latency period to generate the first delayed command/address signal CAD<1>.

The fourth delay circuit 213<2> may delay the internal clock signal ICLK to generate a first delayed clock signal DCLK<1>. The fourth delay circuit 213<2> may delay the internal clock signal ICLK by the write latency period and the read latency period to generate the first delayed clock signal DCLK<1>.

The fifth delay circuit 213<3> may delay the inverted internal clock signal ICLKB to generate a second delayed clock signal DCLK<2>. The fifth delay circuit 213<3> may delay the inverted internal clock signal ICLKB by the write latency period and the read latency period to generate a second delayed clock signal DCLK<2>.

The second synchronization circuit 213<4> may be synchronized with the first delayed clock signal DCLK<1> to output the first delayed command/address signal CAD<1> as the first rising internal command/address signal ICAR<1>. The second synchronization circuit 213<4> may output the first delayed command/address signal CAD<1> as the first rising internal command/address signal ICAR<1> while the first delayed clock signal DCLK<1> has a logic "high" level. The second synchronization circuit 213<4> may be realized by using a flip-flop.

The third synchronization circuit 213<5> may be synchronized with the second delayed clock signal DCLK<2> to output the first delayed command/address signal CAD<1> as the first falling internal command/address signal ICAF<1>. The third synchronization circuit 213<5> may output the first delayed command/address signal CAD<1> as the first falling internal command/address signal ICAF<1> while the second delayed clock signal DCLK<2> has a logic "high" level. The third synchronization circuit 213<5> may be realized by using a flip-flop.

Meanwhile, the second internal buffer circuit 213_2 that is illustrated in FIG. 6 may be realized to have substantially the same circuit as the first internal buffer circuit 213_1, illustrated in FIG. 7, except input/output (I/O) signals thereof. Thus, a detailed description of the second internal buffer circuit 213_2 will be omitted hereinafter.

Figure 8:
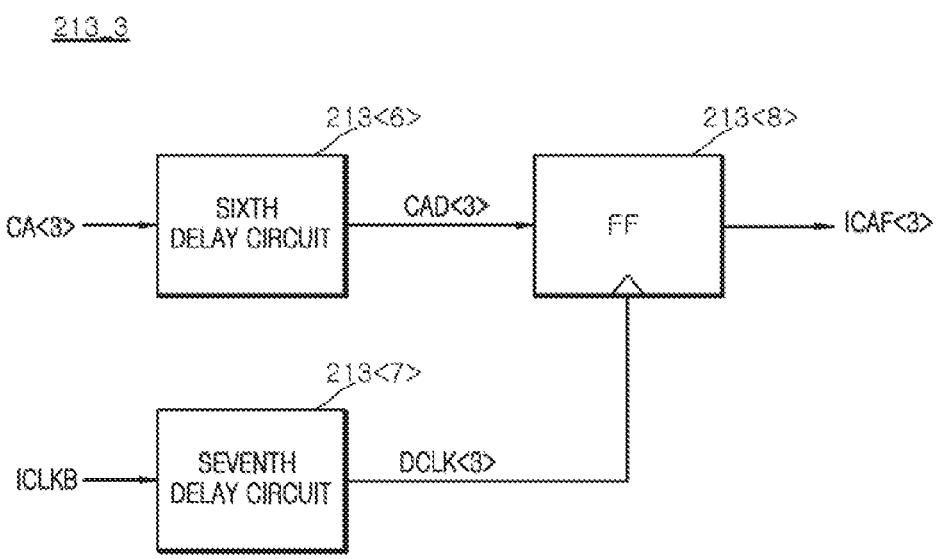
FIG. 8 is a block diagram, illustrating a configuration of a third internal buffer circuit, included in the command/address buffer, illustrated in FIG. 6.

As illustrated in FIG. 8, the third internal buffer circuit 213_3 may include a sixth delay circuit 213<6>, a seventh delay circuit 213<7>, and a fourth synchronization circuit 213<8>.

The sixth delay circuit 213<6> may delay the third command/address signal CA<3> to generate a third delayed command/address signal CAD<3>. The sixth delay circuit 213<6> may delay the third command/address signal CA<3> by the write latency period and the read latency period to generate the third delayed command/address signal CAD<3>.

The seventh delay circuit 213<7> may delay the inverted internal clock signal ICLKB to generate a third delayed clock signal DCLK<3>. The seventh delay circuit 213<7> may delay the inverted internal clock signal ICLKB by the write latency period and the read latency period to generate the third delayed clock signal DCLK<3>.

The fourth synchronization circuit 213<8> may be synchronized with the third delayed clock signal DCLK<3> to output the third delayed command/address signal CAD<3> as the third falling internal command/address signal ICAF<3>. The fourth synchronization circuit 213<8> may output the third delayed command/address signal CAD<3> as the third falling internal command/address signal ICAF<3> while the third delayed clock signal DCLK<3> has a logic "high" level. The fourth synchronization circuit 213<8> may be realized by using a flip-flop.

Meanwhile, each of the fourth to sixth internal buffer circuits 213_4, 213_5, and 213_6, illustrated in FIG. 6, may be realized to have substantially the same circuit as the third internal buffer circuit 213_3, illustrated in FIG. 8, except input/output (I/O) signals thereof. Thus, detailed descriptions of the fourth to sixth internal buffer circuits 213_4, 213_5, and 213_6 will be omitted hereinafter.

Figure 9:
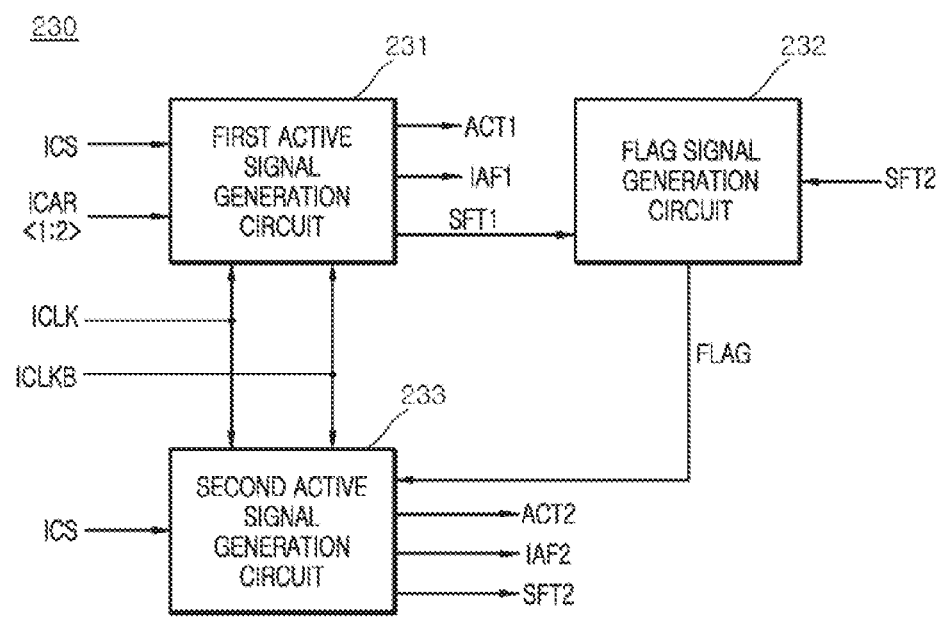
FIG. 9 is a block diagram, illustrating a configuration of an active control circuit, included in the semiconductor device, illustrated in FIG. 2.

As illustrated in FIG. 9, the active control circuit 230 may include a first active signal generation circuit 231, a flag signal generation circuit 232, and a second active signal generation circuit 233.

The first active signal generation circuit 231 may be synchronized with the internal clock signal ICLK and the inverted internal clock signal ICLKB to generate the first active signal ACT1, the first address latch control signal IAF1, and a first shift signal SFT1 that are sequentially enabled when the internal chip selection signal ICS and the first and second rising internal command/address signals ICAR<1:2> have a predetermined logic level combination. The first active signal generation circuit 231 may generate the first active signal ACT1 that is enabled when the internal chip selection signal ICS and the first and second rising internal command/address signals ICAR<1:2> have a predetermined logic level combination. The first active signal generation circuit 231 may be synchronized with the inverted internal clock signal ICLKB to generate the first address latch control signal IAF1 based on the first active signal ACT1. The first active signal generation circuit 231 may be synchronized with the internal clock signal ICLK to generate the first shift signal SFT1 based on the first address latch control signal IAF1.

The flag signal generation circuit 232 may generate a flag signal FLAG that is enabled during a period based on a point in time in which the first shift signal SFT1 is inputted to the flag signal generation circuit 232 until a point in time in which a second shift signal SFT2 is inputted to the flag signal generation circuit 232. The flag signal generation circuit 232 may generate the flag signal FLAG that is enabled at a point in time in which the first shift signal SFT1 is inputted. The flag signal generation circuit 232 may generate the flag signal FLAG that is disabled at a point in time in which the second shift signal SFT2 is inputted to the flag signal generation circuit 232 after the first shift signal SFT1 is inputted to the flag signal generation circuit 232.

The second active signal generation circuit 233 may be synchronized with the internal clock signal ICLK and the inverted internal clock signal ICLKB to generate the second active signal ACT2, the second address latch control signal IAF2, and the second shift signal SFT2, which are sequentially enabled when the internal chip selection signal ICS is inputted while the flag signal FLAG is enabled. The second active signal generation circuit 233 may generate the second active signal ACT2 that is enabled when the internal chip selection signal ICS is inputted while the flag signal FLAG is enabled. The second active signal generation circuit 233 may be synchronized with the inverted internal clock signal ICLKB to generate the second address latch control signal IAF2 based on the second active signal ACT2. The second active signal generation circuit 233 may be synchronized with the internal clock signal ICLK to generate the second shift signal SFT2 based on the second address latch control signal IAF2.

Figure 10:
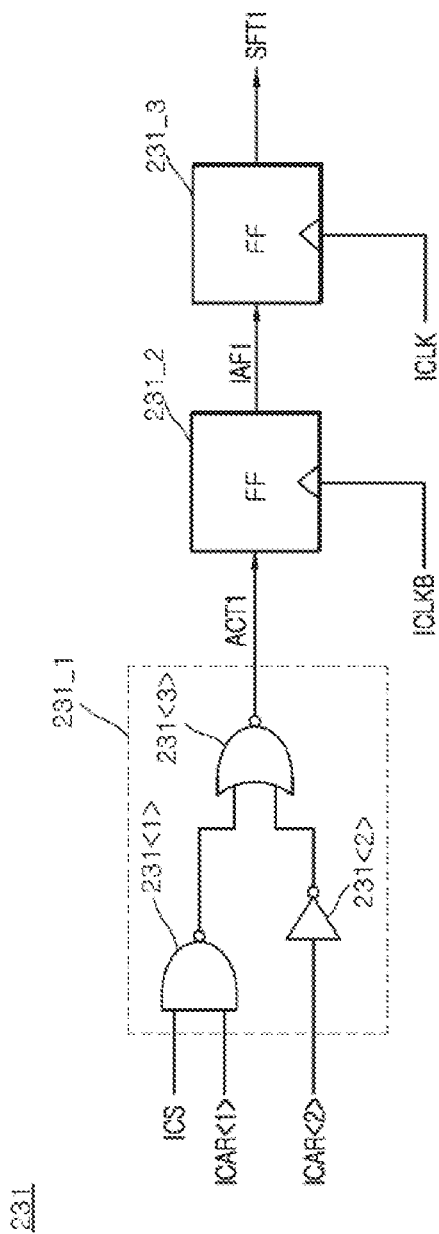
FIG. 10 illustrates a configuration of a first active signal generation circuit, included in the active control circuit, illustrated in FIG. 9.

As illustrated in FIG. 10, the first active signal generation circuit 231 may include a first logic circuit 231_1, a fifth synchronization circuit 231_2, and a sixth synchronization circuit 231_3.

The first logic circuit 231_1 may be realized by using a NAND gate 231<1>, an inverter 231<2>, and a NOR gate 231<3>. The first logic circuit 231_1 may generate the first active signal ACT1 that is enabled when the internal chip selection signal ICS and the first and second rising internal command/address signals ICAR<1:2> have a predetermined logic level combination. The first logic circuit 231_1 may generate the first active signal ACT1 that is enabled to have a logic "high" level when the internal chip selection signal ICS has a logic "high" level, the first rising internal command/address signal ICAR<1> has a logic "high" level, and the second rising internal command/address signal ICAR<2> has a logic "low" level.

The fifth synchronization circuit 231_2 may be synchronized with the inverted internal clock signal ICLKB to output the first active signal ACT1 as the first address latch control signal IAF1. The fifth synchronization circuit 231_2 may output the first active signal ACT1 as the first address latch control signal IAF1 while the inverted internal clock signal ICLKB with a logic "high" level is inputted to the fifth synchronization circuit 231_2. The fifth synchronization circuit 231_2 may be realized by using a flip-flop.

The sixth synchronization circuit 231_3 may be synchronized with the internal clock signal ICLK to output the first address latch control signal IAF1 as the first shift signal SFT1. The sixth synchronization circuit 231_3 may output the first address latch control signal IAF1 as the first shift signal SFT1 while the internal clock signal ICLK with a logic "high" level is inputted to the sixth synchronization circuit 231_3. The sixth synchronization circuit 231_3 may be realized by using a flip-flop.

Figure 11:
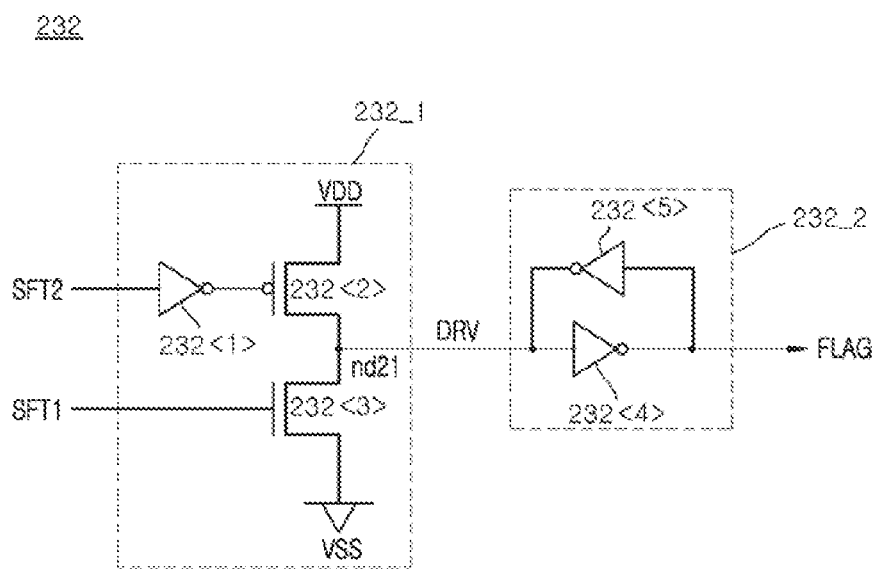
FIG. 11 is a circuit diagram, illustrating a configuration of a flag signal generation circuit, included in the active control circuit, illustrated in FIG. 9.

As illustrated in FIG. 11, the flag signal generation circuit 232 may include a drive signal generation circuit 232_1 and a latch circuit 232_2.

The drive signal generation circuit 232_1 may be realized by using an inverter 232<1>, a PMOS transistor 232<2>, and an NMOS transistor 232<3>. The drive signal generation circuit 232_1 may turn on the NMOS transistor 232<3> to drive a node nd21 to a ground voltage VSS when the first shift signal SFT1 with a logic "high" level is inputted to the drive signal generation circuit 232_1. The drive signal generation circuit 232_1 may generate a drive signal DRV with a logic "low" level when the node nd21 is driven to have the ground voltage VSS. The drive signal generation circuit 232_1 may turn on the PMOS transistor 232<2> to drive the node nd21 to a power supply voltage VDD when the second shift signal SFT2 with a logic "high" level is inputted to the drive signal generation circuit 232_1. The drive signal generation circuit 232_1 may generate the drive signal DRV with a logic "high" level when the node nd21 is driven to have the power supply voltage VDD.

The latch circuit 232_2 may be realized by using inverters 232<4> and 232<5>. The latch circuit 232_2 may latch the drive signal DRV. The latch circuit 232_2 may inversely buffer the latched signal of the drive signal DRV to generate the flag signal FLAG.

Figure 12:
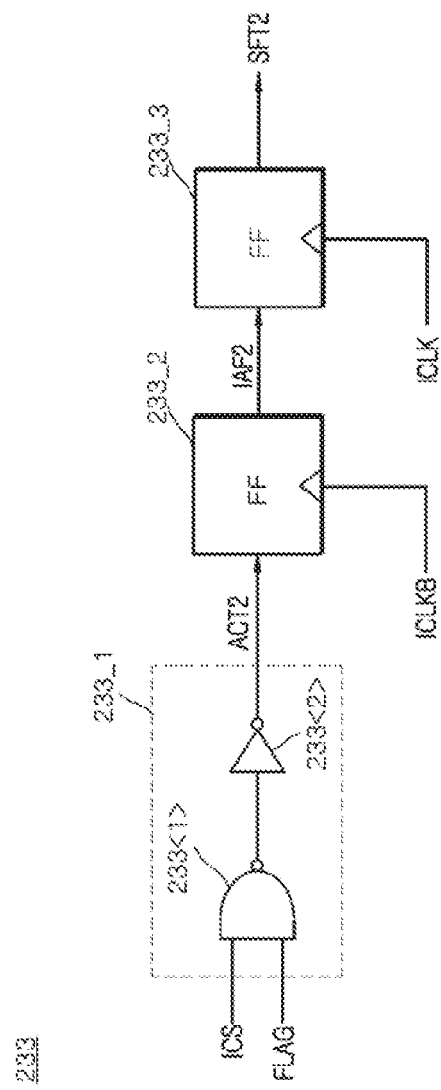
FIG. 12 illustrates a configuration of a second active signal generation circuit, included in the active control circuit, illustrated in FIG. 9.

As illustrated in FIG. 12, the second active signal generation circuit 233 may include a second logic circuit 233_1, a seventh synchronization circuit 233_2, and an eighth synchronization circuit 233_3.

The second logic circuit 233_1 may be realized by using a NAND gate 233<1> and an inverter 233<2>. The second logic circuit 233_1 may generate the second active signal ACT2 based on logic levels of the flag signal FLAG and the internal chip selection signal ICS. The second logic circuit 233_1 may generate the second active signal ACT2 that is enabled to have a logic "high" level when the internal chip selection signal ICS has a logic "high" level while the flag signal FLAG is enabled to have a logic "high" level.

The seventh synchronization circuit 233_2 may be synchronized with the inverted internal clock signal ICLKB to output the second active signal ACT2 as the second address latch control signal IAF2. The seventh synchronization circuit 233_2 may output the second active signal ACT2 as the second address latch control signal IAF2 while the inverted internal clock signal ICLKB with a logic "high" level is inputted to the seventh synchronization circuit 233_2. The seventh synchronization circuit 233_2 may be realized by using a flip-flop.

The eighth synchronization circuit 233_3 may be synchronized with the internal clock signal ICLK to output the second address latch control signal IAF2 as the second shift signal SFT2. The eighth synchronization circuit 233_3 may output the second address latch control signal IAF2 as the second shift signal SFT2 while the internal clock signal ICLK with a logic "high" level is inputted to the eighth synchronization circuit 233_3. The eighth synchronization circuit 233_3 may be realized by using a flip-flop.

Figure 13:
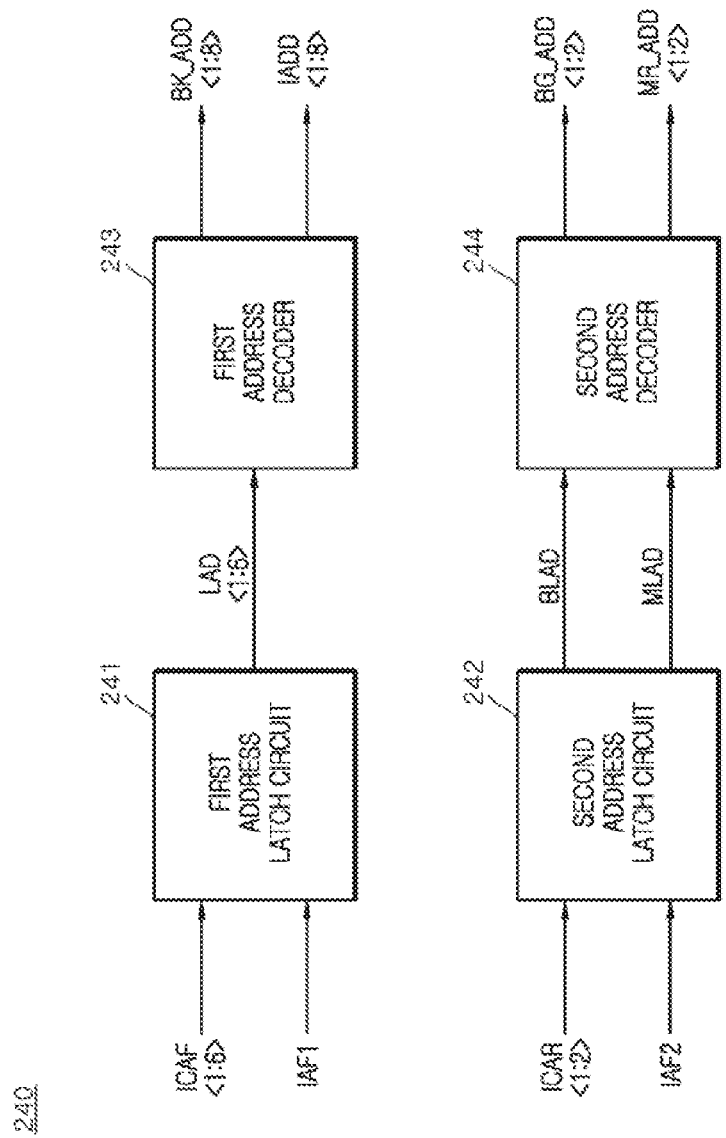
FIG. 13 is a block diagram, illustrating a configuration of an address generation circuit, included in the semiconductor device, illustrated in FIG. 2.

As illustrated in FIG. 13, the address generation circuit 240 may include a first address latch circuit 241, a second address latch circuit 242, a first address decoder 243, and a second address decoder 244.

The first address latch circuit 241 may latch the first to sixth falling internal command/address signals ICAF<1:6> based on the first address latch control signal IAF1. The first address latch circuit 241 may generate first to sixth latch address signals LAD<1:6> based on the latched signals of the first to sixth falling internal command/address signals ICAF<1:6>. The first address latch circuit 241 may latch the first to sixth falling internal command/address signals ICAF<1:6> to generate the first to sixth latch address signals LAD<1:6> when the first address latch control signal IAF1 is enabled to have a logic "high" level.

The second address latch circuit 242 may latch the first and second rising internal command/address signals ICAR<1:2> based on the second address latch control signal IAF2. The second address latch circuit 242 may generate a bank group latch address BLAD based on the latched signal of the first rising internal command/address signal ICAR<1>. The second address latch circuit 242 may latch the first rising internal command/address signal ICAR<1> to generate the bank group latch address BLAD when the second address latch control signal IAF2 is enabled to have a logic "high" level. The second address latch circuit 242 may generate a memory latch address MLAD based on the latched signal of the second rising internal command/address signal ICAR<2>. The second address latch circuit 242 may latch the second rising internal command/address signal ICAR<2> to generate the memory latch address MLAD when the second address latch control signal IAF2 is enabled to have a logic "high" level.

The first address decoder 243 may decode the first to sixth latch address signals LAD<1:6> to generate the first to eighth bank address signals BK_ADD<1:8> and the first to eighth internal address signals IADD<1:8>. The first address decoder 243 may decode the first to sixth latch address signals LAD<1:6> to generate the first to eighth bank address signals BK_ADD<1:8>, one of which is selectively enabled. The first address decoder 243 may decode the first to sixth latch address signals LAD<1:6> to generate the first to eighth internal address signals IADD<1:8>, one of which is selectively enabled.

The second address decoder 244 may decode the bank group latch address BLAD and the memory latch address MLAD to generate the first and second bank group address signals BG_ADD<1:2> and the first and second memory address signals MR_ADD<1:2>. The second address decoder 244 may generate the first and second bank group address signals BG_ADD<1:2>, one of which is selectively enabled based on a logic level of the bank group latch address BLAD. The second address decoder 244 may generate the first bank group address signal BG_ADD<1> that is enabled to have a logic "high" level when the bank group latch address BLAD has a logic "low" level. The second address decoder 244 may generate the second bank group address signal BG_ADD<2> that is enabled to have a logic "high" level when the bank group latch address BLAD has a logic "high" level. The second address decoder 244 may generate the first and second memory address signals MR_ADD<1:2>, one of which is selectively enabled based on a logic level of the memory latch address MLAD. The second address decoder 244 may generate the first memory address signal MR_ADD<1> that is selectively enabled to have a logic "high" level when the memory latch address MLAD has a logic "low" level. The second address decoder 244 may generate the second memory address signal MR_ADD<2> that is selectively enabled to have a logic "high" level when the memory latch address MLAD has a logic "high" level.

Figure 14:
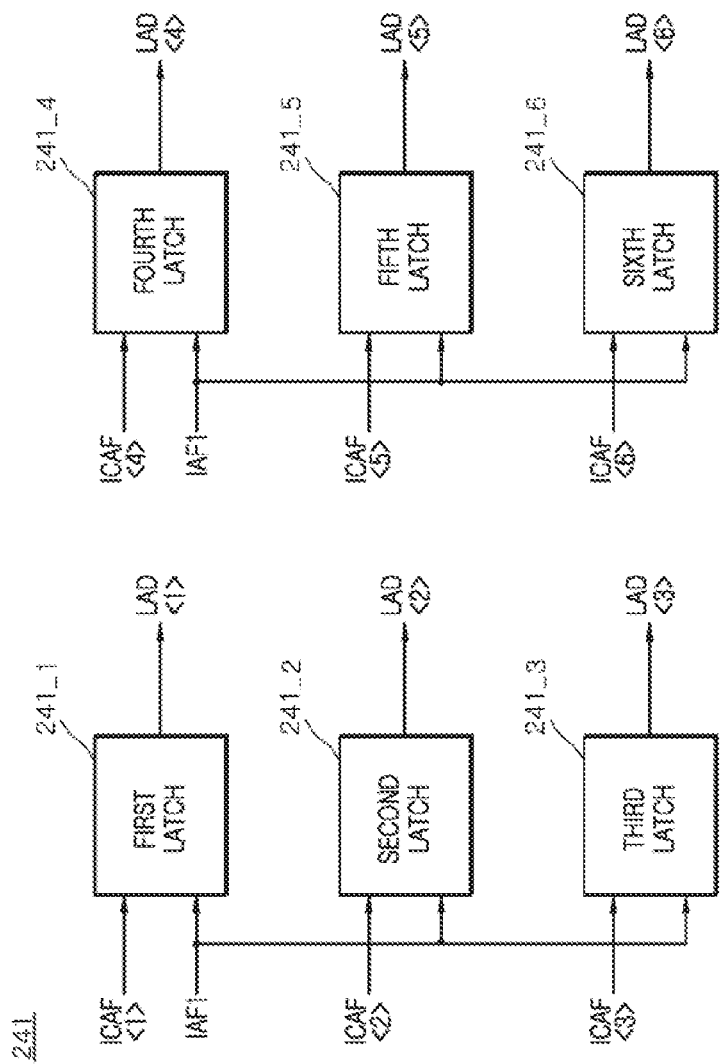
FIG. 14 is a block diagram, illustrating a configuration of a first address latch circuit, included in the address generation circuit, illustrated in FIG. 13.

As illustrated in FIG. 14, the first address latch circuit 241 may include a first latch 241_1, a second latch 241_2, a third latch 241_3, a fourth latch 241_4, a fifth latch 241_5, and a sixth latch 241_6.

The first latch 241_1 may latch the first falling internal command/address signal ICAF<1> based on the first address latch control signal IAF1. The first latch 241_1 may generate the first latch address signal LAD<1> based on the latched signal of the first falling internal command/address signal ICAF<1>.

The second latch 241_2 may latch the second falling internal command/address signal ICAF<2> based on the first address latch control signal IAF1. The second latch 241_2 may generate the second latch address signal LAD<2> based on the latched signal of the second falling internal command/address signal ICAF<2>.

The third latch 241_3 may latch the third falling internal command/address signal ICAF<3> based on the first address latch control signal IAF1. The third latch 241_3 may generate the third latch address signal LAD<3> based on the latched signal of the third falling internal command/address signal ICAF<3>.

The fourth latch 241_4 may latch the fourth falling internal command/address signal ICAF<4> based on the first address latch control signal IAF1. The fourth latch 241_4 may generate the fourth latch address signal LAD<4> based on the latched signal of the fourth falling internal command/address signal ICAF<4>.

The fifth latch 241_5 may latch the fifth falling internal command/address signal ICAF<5> based on the first address latch control signal IAF1. The fifth latch 241_5 may generate the fifth latch address signal LAD<5> based on the latched signal of the fifth falling internal command/address signal ICAF<5>.

The sixth latch 241_6 may latch the sixth falling internal command/address signal ICAF<6> based on the first address latch control signal IAF1. The sixth latch 241_6 may generate the sixth latch address signal LAD<6> based on the latched signal of the sixth falling internal command/address signal ICAF<6>.

Figure 15:
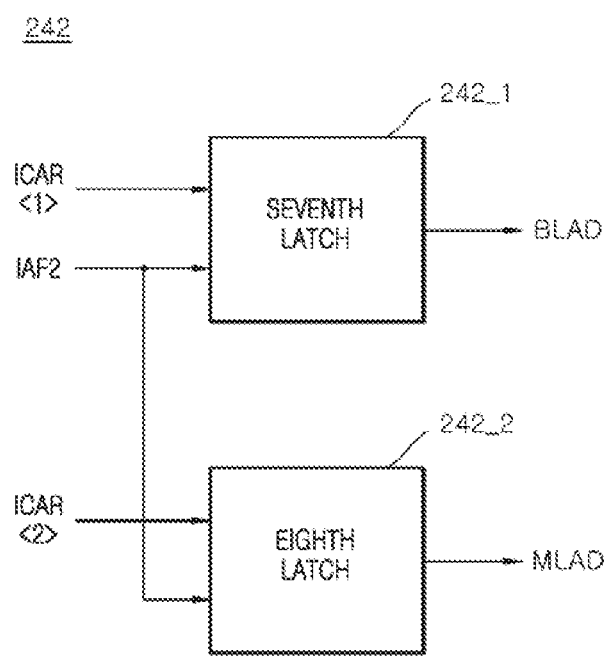
FIG. 15 is a block diagram, illustrating a configuration of a second address latch circuit, included in the address generation circuit, illustrated in FIG. 13.

As illustrated in FIG. 15, the second address latch circuit 242 may include a seventh latch 242_1 and an eighth latch 242_2.

The seventh latch 242_1 may latch the first rising internal command/address signal ICAR<1> based on the second address latch control signal IAF2. The seventh latch 242_1 may generate the bank group latch address BLAD based on the latched signal of the first rising internal command/address signal ICAR<1>.

The eighth latch 242_2 may latch the second rising internal command/address signal ICAR<2> based on the second address latch control signal IAF2. The eighth latch 242_2 may generate the memory latch address MLAD based on the latched signal of the second rising internal command/address signal ICAR<2>.

Figure 16:
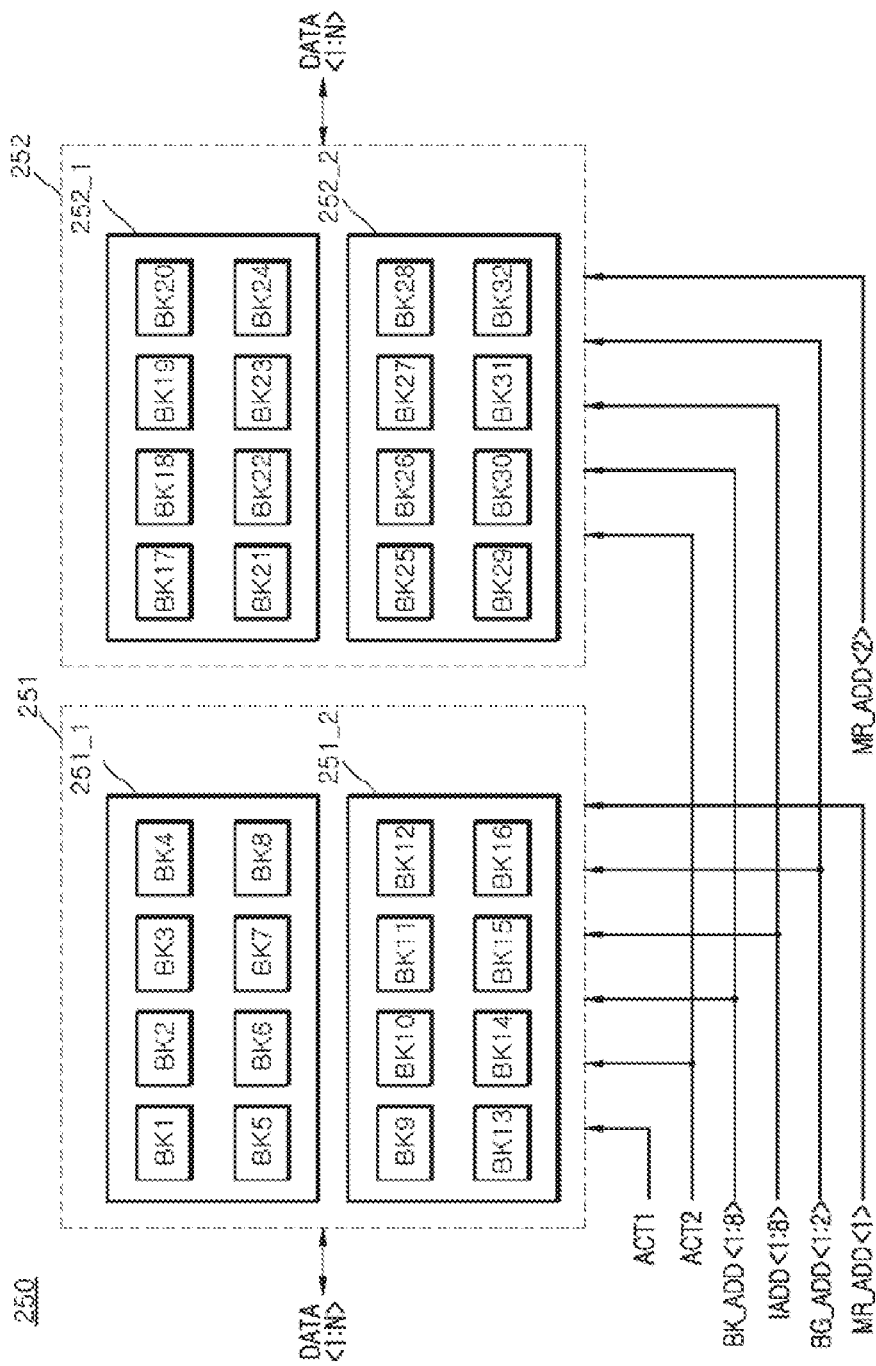
FIG. 16 is a block diagram, illustrating a configuration of a core circuit, included in the semiconductor device, illustrated in FIG. 2.

As illustrated in FIG. 16, the core circuit 250 may include the first memory region 251 and the second memory region 252.

The first memory region 251 may include a first bank group 251_1 and a second bank group 251_2.

The first bank group 251_1 may include a first bank BK1, a second bank BK2, a third bank BK3, a fourth bank BK4, a fifth bank BK5, a sixth bank BK6, a seventh bank BK7, and an eighth bank BK8.

The first bank BK1 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the first bank address signal BK_ADD<1> are enabled.

The second bank BK2 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the second bank address signal BK_ADD<2> are enabled.

The third bank BK3 may receive or output the first to Nt data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the third bank address signal BK_ADD<3> are enabled.

The fourth bank BK4 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the fourth bank address signal BK_ADD<4> are enabled.

The fifth bank BK5 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the fifth bank address signal BK_ADD<5> are enabled.

The sixth bank BK6 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the sixth bank address signal BK_ADD<6> are enabled.

The seventh bank BK7 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the seventh bank address signal BK_ADD<7> are enabled.

The eighth bank BK8 may receive or output the first to $N^{th}$ data DATA<1:N> based on the first to eighth internal address signals IADD<1:8> when any one of the first and second active signals ACT1 and ACT2 is enabled and the first memory address signal MR_ADD<1>, the first bank group address signal BG_ADD<1>, and the eighth bank address signal BK_ADD<8> are enabled.

The second bank group 251_2 may include a ninth bank BK9, a tenth bank BK10, an eleventh bank BK11, a twelfth bank BK12, a thirteenth bank BK13, a fourteenth bank BK14, a fifteenth bank BK15, and a sixteenth bank BK16. The second bank group 251_2 may be realized to perform the same operation as the first bank group 251_1 based on the second bank group address signal BG_ADD<2> instead of the first bank group address signal BG_ADD<1>. Thus, a detailed description of the second bank group 251_2 will be omitted hereinafter.

The second memory region 252 may include a third bank group 252_1 and a second bank group 252_2.

The third bank group 252_1 may include a seventeenth bank BK17, an eighteenth bank BK18, a nineteenth bank BK19, a twentieth bank BK20, a twenty-first bank BK21, a twenty-second bank BK22, a twenty-third bank BK23, and a twenty-fourth bank BK24.

The seventeenth bank BK17 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the first bank address signal BK_ADD<1> are enabled.

The eighteenth bank BK18 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the second bank address signal BK_ADD<2> are enabled.

The nineteenth bank BK19 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the third bank address signal BK_ADD<3> are enabled.

The twentieth bank BK20 may receive or output the first to $N^{th}$ data DATA<1:N> based on the first to eighth internal address signals IADD<1:8> when the second active signal ACT2 is enabled and the second memory address signal MR_ADD<2>, the first bank group address signal BGADD<1>, and the fourth bank address signal BK_ADD<4> are enabled.

The twenty-first bank BK21 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the fifth bank address signal BK_ADD<5> are enabled.

The twenty-second bank BK22 may receive or output the first to $N^{th}$ data DATA<1:N> based on the first to eighth internal address signals IADD<1:8> when the second active signal ACT2 is enabled and the second memory address signal MRADD<2>, the first bank group address signal BG_ADD<1>, and the sixth bank address signal BK_ADD<6> are enabled.

The twenty-third bank BK23 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the seventh bank address signal BK_ADD<7> are enabled.

The twenty-fourth bank BK24 may receive or output the first to $N^{th}$ data DATA<1:N> based on the first to eighth internal address signals IADD<1:8> when the second active signal ACT2 is enabled and the second memory address signal MR_ADD<2>, the first bank group address signal BG_ADD<1>, and the eighth bank address signal BK_ADD<8> are enabled.

The fourth bank group 252_2 may include a twenty-fifth bank BK25, a twenty-sixth bank BK26, an twenty-seventh bank BK27, a twenty-eighth bank BK28, a twenty-ninth bank BK29, a thirtieth bank BK30, a thirty-first bank BK31, and a thirty-second bank BK32. The fourth bank group 252_2 may be realized to perform the same operation as the third bank group 252_1 based on the second bank group address signal BG_ADD<2> instead of the first bank group address signal BG_ADD<1>. Thus, the detailed description of the fourth bank group 252_2 will be omitted hereinafter.

Figure 17:
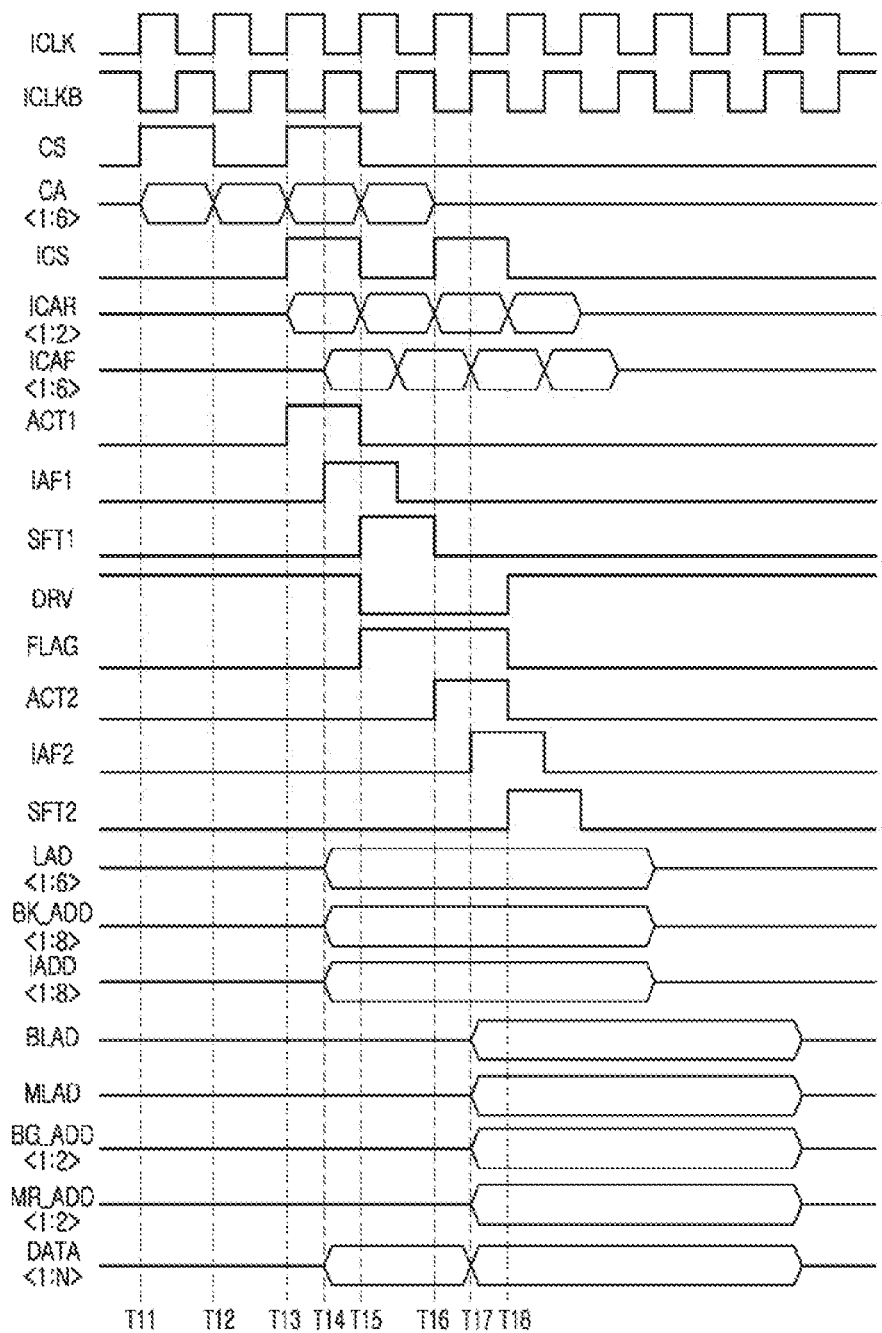
FIG. 17 is a timing diagram, illustrating an operation of an electronic device, according to an embodiment of the present disclosure.

An operation of the electronic device 100, according to an embodiment of the present disclosure, will be described hereinafter with reference to FIG. 17 in conjunction with an operation that expands a memory region for outputting data during the first and second active operations.

At time "T11", the controller 110 may output the clock signal CLK as well as the chip selection signal CS and the first to sixth command/address signals CA<1:6> with a predetermined logic level combination to perform the first active operation.

The clock buffer 211 may buffer the clock signal CLK to generate the input clock signal IN_CLK.

The internal clock generation circuit 220 may receive the input clock signal IN_CLK to generate the internal clock signal ICLK and the inverted internal clock signal ICLKB.

At a point time "T12", the controller 110 may output the first to sixth command/address signals CA<1:6> to generate the first to eighth bank address signals BK_ADD<1:8> and the first to eighth internal address signals IADD<1:8> during the active operation.

At time "T13", the controller 110 may output the clock signal CLK, the chip selection signal CS with a logic "high" level, and the first to sixth command/address signals CA<1:6> to perform the second active operation.

The chip selection signal buffer 212 may buffer the chip selection signal CS, which is inputted in synchronization with a rising edge of the internal clock signal ICLK at the point in time "T11", to generate the internal chip selection signal ICS with a logic "high" level.

The command/address buffer 213 may buffer the first and second command/address signals CA<1:2>, which are inputted in synchronization with a rising edge of the internal clock signal ICLK at the point in time "T11", to generate the first and second rising internal command/address signals ICAR<1:2>.

The first logic circuit 231_1 of the first active signal generation circuit 231 may generate the first active signal ACT1 that is enabled to have a logic "high" level based on the internal chip selection signal ICS with a logic "high" level, the first rising internal command/address signal ICAR<1> with a logic "high" level, and the second rising internal command/address signal ICAR<2> with a logic "low" level.

At time "T14", the command/address buffer 213 may buffer the first to sixth command/address signals CA<1:6>, which are inputted in synchronization with a rising edge of the inverted internal clock signal ICLKB at the point in time "T12", to generate the first to sixth falling internal command/address signals ICAF<1:6>.

The fifth synchronization circuit 231_2 may be synchronized with a rising edge of the inverted internal clock signal ICLKB to generate the first address latch control signal IAF1 with a logic "high" level based on the first active signal ACT1.

The first address latch circuit 241 may latch the first to sixth falling internal command/address signals ICAF<1:6> based on the first address latch control signal IAF1 with a logic "high" level. The first address latch circuit 241 may generate the first to sixth latch address signals LAD<1:6> based on the latched signals of the first to sixth falling internal command/address signals ICAF<1:6>.

The first address decoder 243 may decode the first to sixth latch address signals LAD<1:6> to generate the first to eighth bank address signals BK_ADD<1:8> and the first to eighth internal address signals IADD<1:8>.

The first memory region 251 may output the first to N data DATA<1:N> through a bank that is selected by the first active signal ACT1 with a logic "high" level, the first to eighth bank address signals BK_ADD<1:8>, and the first to eighth internal address signals IADD<1:8>.

At time "T15", the controller 110 may output the first to sixth command/address signals CA<1:6> to generate the first to eighth bank address signals BK_ADD<1:8> and the first to eighth internal address signals IADD<1:8> during the second active operation.

The sixth synchronization circuit 231_3 of the first active signal generation circuit 231 may be synchronized with a rising edge of the internal clock signal ICLK to generate the first shift signal SFT1 with a logic "high" level based on the first address latch control signal IAF1.

The drive signal generation circuit 232_1 of the flag signal generation circuit 232 may generate the drive signal DRV with a logic "low" level based on the first shift signal SFT1 with a logic "high" level.

The latch circuit 232_2 of the flag signal generation circuit 232 may inversely buffer the drive signal DRV with a logic "low" level to generate the flag signal FLAG with a logic "high" level.

At time "T16", the chip selection signal buffer 212 may buffer the chip selection signal CS, which is inputted in synchronization with a rising edge of the internal clock signal ICLK at the point in time "T13", to generate the internal chip selection signal ICS with a logic "high" level.

The command/address buffer 213 may buffer the first and second command/address signals CA<1:2>, which are inputted in synchronization with a rising edge of the internal clock signal ICLK at the point in time "T13", to generate the first and second rising internal command/address signals ICAR<1:2>.

The second logic circuit 233_1 of the second active signal generation circuit 233 may generate the second active signal ACT2 that is enabled to have a logic "high" level based on the flag signal FLAG with a logic "high" level and the internal chip selection signal ICS with a logic "high" level.

At time "T17", the seventh synchronization circuit 233_2 of the second active signal generation circuit 233 may be synchronized with a rising edge of the inverted internal clock signal ICLKB to generate the second address latch control signal IAF2 with a logic "high" level based on the second active signal ACT2.

The second address latch circuit 242 may latch the first and second rising internal command/address signals ICAR<1:2> based on the second address latch control signal IAF2 with a logic "high" level. The second address latch circuit 242 may generate the bank group latch address BLAD based on the latched signal of the first rising internal command/address signal ICAR<1>. The second address latch circuit 242 may generate the memory latch address MLAD based on the second rising internal command/address signal ICAR<2> that is latched by the second address latch control signal IAF2 with a logic "high" level.

The second address decoder 244 may decode the bank group latch address BLAD and the memory latch address MLAD to generate the first and second bank group address signals BG_ADD<1:2> and the first and second memory address signals MR_ADD<1:2>.

The second memory region 252 may output the first to $N^{th}$ data DATA<1:N> through a bank that is selected by the second active signal ACT2 with a logic "high" level, the first and second memory address signals MR_ADD<1:2>, the first and second bank group address signals BG_ADD<1:2>, the first to eighth bank address signals BK_ADD<1:8>, and the first to eighth internal address signals IADD<1:8>.

At time "T18", the eighth synchronization circuit 233_3 of the second active signal generation circuit 233 may be synchronized with a rising edge of the internal clock signal ICLK to generate the second shift signal SFT2 with a logic "high" level based on the second address latch control signal IAF2.

The drive signal generation circuit 232_1 of the flag signal generation circuit 232 may generate the drive signal DRV with a logic "low" level based on the second shift signal SFT2 with a logic "high" level.

The latch circuit 232_2 of the flag signal generation circuit 232 may inversely buffer the drive signal DRV with a logic "high" level to generate the flag signal FLAG with a logic "low" level.

As described above, an electronic device according to an embodiment may additionally receive an address through a command/address signal based on a chip selection signal during a second active operation after a first active operation, thereby expanding a memory region to perform a data input/output (I/O) operation. In addition, the electronic device may generate a second active signal based on the chip selection signal after a first active signal is generated by the chip selection signal and the command/address signal, thereby reducing the number of bits that are included in the command/address signal to perform the second active operation. As a result, it may be possible to add the information that is inputted through the command/address signal.

Figure 18:
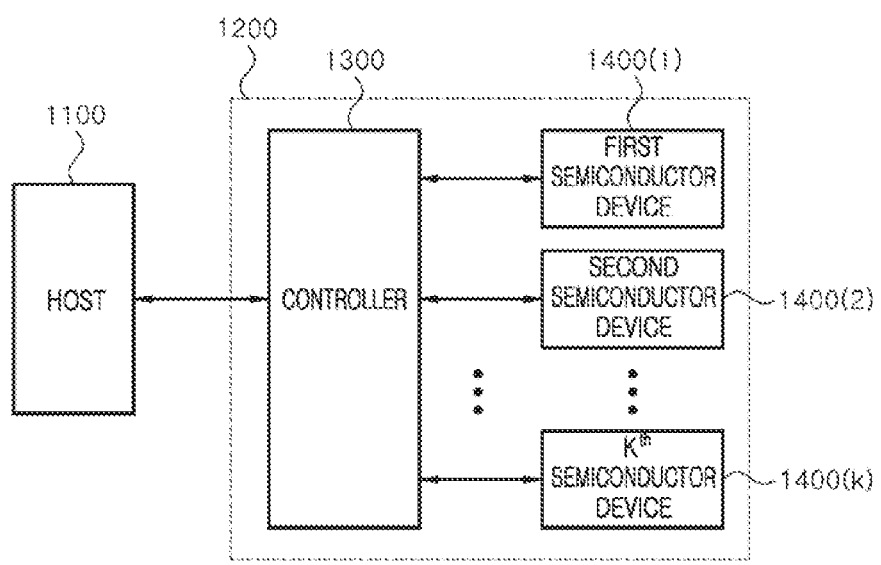
FIG. 18 is a block diagram, illustrating a configuration of an electronic system that employs the electronic device, illustrated in FIGS. 1 to 17.

FIG. 18 is a block diagram illustrating a configuration of an electronic system 1000 according to an embodiment of the present disclosure. As illustrated in FIG. 18, the electronic system 1000 may include a host 1100 and a semiconductor system 1200.

The host 1100 and the semiconductor system 1200 may transmit signals to each other by using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform an active operation. Each of the semiconductor devices 1400(K:1) may additionally receive an address through a command/address signal based on a chip selection signal during a second active operation after a first active operation, thereby expanding a memory region to perform a data input/output (I/O) operation. In addition, each of the semiconductor devices 1400(K:1) may generate a second active signal based on the chip selection signal after a first active signal is generated by the chip selection signal and the command/address signal, thereby reducing the number of bits that are included in the command/address signal to perform the second active operation. As a result, it may be possible to add the information that is inputted through the command/address signal.

The controller 1300 may be realized by using the controller 110, illustrated in FIG. 1. Each of the semiconductor devices 1400(K:1) may be realized by using the semiconductor device 120, illustrated in FIG. 1. In some embodiments, the semiconductor device 120 may be realized by using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. An electronic device comprising:
a controller configured to output a clock signal, a chip selection signal, and a command/address signal and configured to receive or output a first data and a second data; and
a semiconductor device configured to be synchronized with the clock signal to receive or output the first data from or to a first memory region that is selected by the command/address signal when the chip selection signal and the command/address signal have a logic level combination to perform a first active operation and configured to be synchronized with the clock signal to receive or output the second data from or to the first memory region and a second memory region that are selected by the command/address signal based on the chip selection signal during a second active operation after the first active operation.

2. The electronic device of claim 1,
wherein the first active operation is an operation to receive or output the first data from or to the first memory region; and
wherein the second active region is an operation for receiving or outputting the first and second data from or to the first and second memory regions.

3. The electronic device of claim 1, wherein the semiconductor device configured to generate a bank address and an internal address for selecting the first memory region based on the command/address signal that is inputted in synchronization with the clock signal during the first active operation and configured to generate first and second memory address signals, first and second bank group address signals, the bank address, and the internal address for selecting the first memory region and the second memory region based on the command/address signal that is inputted in synchronization with the clock signal during the second active operation.

4. The electronic device of claim 3,
wherein the bank address and the internal address are generated based on the command/address signal inputted in synchronization with a falling edge of the clock signal; and
wherein the first and second memory address signals and the first and second bank group address signals are generated based on the command/address signal inputted in synchronization with a rising edge of the clock signal.

5. The electronic device of claim 1, wherein the semiconductor device includes:
an internal clock generation circuit configured to receive input clock signal, which is generated based on the clock signal, to generate an internal clock signal and an inverted internal clock signal whose phases are opposite to each other;
an active control circuit configured to be synchronized with the internal clock signal and the inverted internal clock signal to generate first and second active signals and first and second address latch control signals for performing the first and second active operations based on an internal chip selection signal, which is generated based on the chip selection signal, and a rising internal command/address signal, which is generated based on the command/address signal;
an address generation circuit configured to generate a bank address and an internal address based on a falling internal command/address signal that is generated based on the command/address signal and the first address latch control signal and configured to generate first and second memory address signals, first and second bank group address signals, the bank address, and the internal address based on the rising internal command/address signal and the falling internal command/address signal based on the second address latch control signal; and
a core circuit configured to perform the first and second active operations for the first memory region based on the first memory address signal, the first and second bank group address signals, the bank address, and the internal address to receive or output the first data when the first and second active signals are enabled and configured to perform the second active operation for the second memory region based on the second memory address signal, the first and second bank group address signals, the bank address, and the internal address to receive or output the second data when the second active signal is enabled.

6. The electronic device of claim 5, wherein the active control circuit includes:
a first active signal generation circuit configured to be synchronized with the internal clock signal and the inverted internal clock signal to generate the first active signal, the first address latch control signal, and a first shift signal, which are sequentially enabled when the internal chip selection signal and the rising internal command/address signal have a predetermined logic level combination;
a flag signal generation circuit configured to generate a flag signal that is enabled during a period based on a point in time in which the first shift signal is inputted until a point in time in which a second shift signal is inputted; and
a second active signal generation circuit configured to be synchronized with the internal clock signal and the inverted internal clock signal to generate the second active signal, the second address latch control signal, and the second shift signal, which are sequentially enabled when the internal chip selection signal is inputted while the flag signal is enabled.

7. The electronic device of claim 6, wherein the first active signal generation circuit includes:
a first logic circuit configured to generate the first active signal that is enabled when the internal chip selection signal and the rising internal command/address signal have a predetermined logic level combination;
a first synchronization circuit configured to be synchronized with the inverted internal clock signal to output the first active signal as the first address latch control signal; and
a second synchronization circuit configured to be synchronized with the internal clock signal to output the first address latch control signal as the first shift signal.

8. The electronic device of claim 6, wherein the flag signal generation circuit includes:
a drive signal generation circuit configured to generate a drive signal based on logic levels of the first and second shift signals; and a latch circuit configured to latch the drive signal and configured to inversely buffer the latched drive signal to generate the flag signal.

9. The electronic device of claim 6, wherein the second active signal generation circuit includes:
a second logic circuit configured to generate the second active signal that is enabled when the internal chip selection signal is inputted while the flag signal is enabled;
a third synchronization circuit configured to be synchronized with the inverted internal clock signal to output the second active signal as the second address latch control signal; and
a fourth synchronization circuit configured to be synchronized with the internal clock signal to output the second address latch control signal as the second shift signal.

10. The electronic device of claim 5, wherein the address generation circuit includes:
a first address latch circuit configured to latch the falling internal command/address signal based on the first address latch control signal to generate a latch address signal;
a second address latch circuit configured to latch the rising internal command/address signal based on the second address latch control signal to generate a bank group latch address and a memory latch address;
a first address decoder configured to decode the latch address signal to generate the bank address signal and the internal address signal; and
a second address decoder configured to decode the bank group latch address and the memory latch address to generate the first and second bank group address signals and the first and second memory address signals.

11. The electronic device of claim 1, wherein the first memory region includes:
a first bank group including a first group of banks and configured to receive or output the first data from or to any one of the first group of banks by a bank address and an internal address when first and second active signals are inputted and a first memory address signal and a first bank group address signal are enabled; and
a second bank group including a second group of banks and configured to receive or output the first data from or to any one of the second group of banks by the bank address and the internal address when the first and second active signals are inputted and the first memory address signal and a second bank group address signal are enabled.

12. The electronic device of claim 11, wherein the second memory region includes:
a third bank group including a third group of banks and configured to receive or output the second data from or to any one of the third group of banks by the bank address and the internal address when the second active signal is inputted and a second memory address signal and the first bank group address signal are enabled; and
a fourth bank group including a fourth group of banks and configured to receive or output the second data from or to any one of the fourth group of banks by the bank address and the internal address when the second active signal is inputted and the second memory address signal and the second bank group address signal are enabled.

13. An electronic device comprising:
an active control circuit configured to generate first and second active signals and first and second address latch control signals to perform first and second active operations of first and second memory regions based on a logic level combination of an internal chip selection signal and a rising internal command/address signal; and
an address generation circuit configured to generate a bank address and an internal address to perform the first and second active operations of the first and second memory regions based on a falling internal command/address signal and the first address latch control signal and configured to generate first and second memory address signals and first and second bank group address signals to perform the second active operation of the first and second memory regions based on a rising internal command/address signal and the second address latch control signal.

14. The electronic device of claim 13, wherein the internal chip selection signal is generated based on a chip selection signal in synchronization with an internal clock signal.

15. The electronic device of claim 13,
wherein the rising internal command/address signal is generated based on a command/address signal in synchronization with an internal clock signal; and
wherein the falling internal command/address signal is generated based on the command/address signal in synchronization with an inverted internal clock signal.

16. The electronic device of claim 13, wherein the first and second memory address signals and the first and second bank group address signals are generated based on the rising internal command/address signal while the internal chip selection signal is enabled.

17. The electronic device of claim 13,
wherein the first active operation is an operation for receiving and outputting first data from or to the first memory region; and
wherein the second active operation is an operation for receiving and outputting the first data and second data from or to the first memory region and the second memory region.

18. The electronic device of claim 13, wherein the active control circuit includes:
a first active signal generation circuit configured to be synchronized with an internal clock signal and an inverted internal clock signal to generate the first active signal, the first address latch control signal, and a first shift signal, which are sequentially enabled when the internal chip selection signal and the rising internal command/address signal have a predetermined logic level combination;
a flag signal generation circuit configured to generate a flag signal that is enabled during a period based on a point in time in which the first shift signal is inputted until a point in time in which a second shift signal is inputted; and
a second active signal generation circuit configured to be synchronized with the internal clock signal and the inverted internal clock signal to generate the second active signal, the second address latch control signal, and the second shift signal, which are sequentially enabled when the internal chip selection signal is inputted while the flag signal is enabled.

19. The electronic device of claim 18, wherein the first active signal generation circuit includes:
a first logic circuit configured to generate the first active signal that is enabled when the internal chip selection signal and the rising internal command/address signal have a predetermined logic level combination;

a first synchronization circuit configured to be synchronized with the inverted internal clock signal to output the first active signal as the first address latch control signal; and a second synchronization circuit configured to be synchronized with the internal clock signal to output the first address latch control signal as the first shift signal.

20. The electronic device of claim 18, wherein the flag signal generation circuit includes:

a drive signal generation circuit configured to generate a drive signal based on logic levels of the first and second shift signals; and a latch circuit configured to latch the drive signal and configured to inversely buffer the latched drive signal to generate the flag signal.

21. The electronic device of claim 18, wherein the second active signal generation circuit includes:

a second logic circuit configured to generate the second active signal that is enabled when the internal chip selection signal is inputted while the flag signal is enabled;

a third synchronization circuit configured to be synchronized with the inverted internal clock signal to output the second active signal as the second address latch control signal; and a fourth synchronization circuit configured to be synchronized with the internal clock signal to output the second address latch control signal as the second shift signal.

22. The electronic device of claim 13, wherein the address generation circuit includes:

a first address latch circuit configured to latch the falling internal command/address signal based on the first address latch control signal to generate a latch address signal;

a second address latch circuit configured to latch the rising internal command/address signal based on the second address latch control signal to generate a bank group latch address and a memory latch address;

a first address decoder configured to decode the latch address signal to generate the bank address signal and the internal address signal; and a second address decoder configured to decode the bank group latch address and the memory latch address to generate the first and second bank group address signals and the first and second memory address signals.

23. The electronic device of claim 13, wherein the first memory region includes:

a first bank group including a first group of banks and configured to receive or output first data from or to any one of the first group of banks by the bank address and the internal address when first and second active signals are inputted during the first and second active operations and the first memory address signal and the first bank group address signal are enabled; and a second bank group including a second group of banks and configured to receive or output the first data from or to any one of the second group of banks by the bank address and the internal address when the first and second active signals are inputted during the first and second active operations and the first memory address signal and the second bank group address signal are enabled.

24. The electronic device of claim 23, wherein the second memory region includes:

a third bank group including a third group of banks and configured to receive or output second data from or to any one of the third group of banks by the bank address and the internal address when the second active signal is inputted during the second active operation and the second memory address signal and the first bank group address signal are enabled; and a fourth bank group including a fourth group of banks and configured to receive or output the second data in any one of the fourth group of banks by the bank address and the internal address when the second active signal is inputted during the second active operation and the second memory address signal and the second bank group address signal are enabled.

* * * * *